United States Patent [19]

Russo et al.

[11] Patent Number: 4,829,457

[45] Date of Patent: May 9, 1989

[54] OVERLOAD PROTECTION CIRCUIT FOR SOLID STATE SWITCH

[75] Inventors: James T. Russo; Victor H. Rigotti; Michael R. Levine, all of Ann Arbor, Mich.

[73] Assignee: Honeywell Incorporated, Minneapolis, Minn.

[21] Appl. No.: 5,150

[22] Filed: Jan. 20, 1987

[51] Int. Cl.$^4$ .......................... H02H 3/00; H01H 9/30
[52] U.S. Cl. .......................................... 364/550; 361/6; 361/13; 307/115; 307/135; 307/141; 307/296.1; 307/592; 323/223; 323/908
[58] Field of Search ............................. 364/480–483, 364/492, 550; 307/115, 134, 135, 141, 292, 296 R, 296.1, 592; 361/5–8, 13, 100, 101, 96, 97, 2; 323/223, 272, 301, 908; 340/594

[56] References Cited

U.S. PATENT DOCUMENTS

| | | | |
|---|---|---|---|
| 3,543,091 | 11/1970 | Marek | 307/592 X |
| 4,206,872 | 6/1980 | Levine | 236/46 R |
| 4,271,460 | 6/1981 | Baker | 323/908 X |
| 4,348,709 | 9/1982 | Mauk et al. | 361/100 X |
| 4,445,183 | 4/1984 | McCollum et al. | 361/13 X |
| 4,538,074 | 8/1985 | Fraden | 307/141.4 X |
| 4,599,672 | 7/1986 | Planer et al. | 307/592 X |
| 4,626,954 | 12/1986 | Damiano et al. | 361/97 X |
| 4,631,470 | 12/1986 | Bingley | 323/908 X |
| 4,695,961 | 9/1987 | Arinobu | 364/484 |
| 4,700,256 | 10/1987 | Howell | 361/8 X |
| 4,704,652 | 11/1987 | Billings | 361/6 X |
| 4,705,963 | 11/1987 | Bax | 307/592 X |
| 4,716,511 | 12/1987 | Masaki | 323/908 |
| 4,724,374 | 2/1988 | Beg | 323/272 |
| 4,734,844 | 3/1988 | Rhoads | 323/272 X |
| 4,737,669 | 4/1988 | Austin | 307/592 |
| 4,763,220 | 8/1988 | Belbel et al. | 361/100 X |

FOREIGN PATENT DOCUMENTS 0068733 5/1980 Japan .................. 307/592

Primary Examiner—Parshotam S. Lall
Assistant Examiner—Joseph L. Dixon
Attorney, Agent, or Firm—Krass & Young

[57] ABSTRACT

A control device for energization of a load employs a bidirection triggerable solid state switching device connected in series with an alternating current power source and the load. In order to prevent the passage of excessive, potentially destructive currents through the switch if the load is shorted out, the microprocessor which controls the energization of the switch senses the time required for the voltage across the switch to attain a predetermined value. If the load is shorted the potential difference across the switch increases and attains the predetermined value a shorter time after zero-crossing of the alternating current. When this occurs more than a predetermined number of consecutive times, the generation of triggering pulses for the solid state switch is inhibited for a predetermined time. In the preferred embodiment the control device is a thermostat for controlling a temperature modifying load such as a furnace or air conditioner.

17 Claims, 3 Drawing Sheets

OVERLOAD PROTECTION CIRCUIT FOR SOLID STATE SWITCH

TECHNICAL FIELD OF THE INVENTION

This invention relates to controllers for loads employing a solid state output switch and means for inhibiting the closure of the solid state output switch when the load impedance is reduced below its normal value to prevent destruction of this switch by excess current flow.

BACKGROUND OF THE INVENTION

Controllers for the energization of furnaces, air conditioners or humidity modifying loads usually include output switches that are connected in series with the load and with an alternating current power supply. The controller stores a desired temperature or humidity set-point and measures the ambient condition. When the ambient condition deviates from the set-point the controller closes the switch to provide power to energize the load and move the ambient condition toward the set-point.

Prior to the advent of solid state switches of sufficient power capacity and suitable cost for use in such controllers, they all employed hard contacts, usually electromagnetic relays or mercury switches, as output devices. While low cost, high capacity solid state switches are now available, their use in such controllers has been limited by their susceptibility to destruction because of excess current flow. The switch is connected in series with the AC power supply and the load, which is usually the relay of a furnace, air conditioner or humidity modifying load. If the load shorts out for some reason unusually high currents flow through the switch. While most hard contact switches can carry unusual overload currents without failing, solid state devices are often permanently damaged by currents appreciably higher than their normal capacity. While it is very uncommon for such a relay coil to short out while in normal operation, they may sometimes be shorted out during the installation or repair of the system.

Protection circuits have been devised for power semiconductors used in applications other than these controllers that sense abnormal currents or other abnormal operating conditions and remove triggering power from the solid state switch. For example, U.S. Pat. No. 4,320,434 entitled "Power Semiconductor Protection Circuit with Fault Detection" discloses a circuit that recognizes a potential failure condition and triggers a low power switch that removes switching current from the power semiconductor and resets both itself and the output switch. These circuits have not been previously emplolyed in controllers of the type described above because they were relatively complicated and thus expensive and they generally required connection to the load beyond those normally available at the controller location.

SUMMARY OF THE INVENTION

The present invention is therefor directed toward a controller employing a semiconductor output switch connected in series with an alternating current power source and a load which includes a protective circuit. This protective circuit prevents the switch from remaining in a conductive mode when the impedance of the load has fallen sufficiently below its nominal value so that excessive currents, potentially destructive to the output switch, would occur if the switch were closed. The circuit of the present invention is extremely simple, adding no appreciable cost to the controller, and is designed to react quickly so that the current rating of the switching semiconductor need not be any higher than that which would be required in a system designed without concern for the failure protection.

A preferred embodiment of the present invention, which will subsequently be disclosed in detail, is incorporated in a thermostat employing a microprocessor as the major portion of its control system and using a power supply for the microprocessor of the type disclosed in U.S. Pat. No. 4,206,872. In that patent the internal microprocessor power supply is connected in shunt with the output switch and in series with the alternating current power source and the load.

When the set-point temperature that has been stored in the thermostat and the ambient temperature measured by the thermostat are such that the load need not be energized, the switch is open and the internal power supply is connected to the alternating current power source through the load. The internal power supply has such low power requirements and high impedance that the current flow does not energize the load.

When the ambient temperature is such that operation of the furnace or air conditioner is required, a triggering signal is applied to the semiconductor switch, typically a triac. The switch will go into a conductive mode when the triggering signal is present and the voltage across its main terminals attains an ignition value. The switch will continue conducting even if the triggering signal is removed, until this voltage across its main terminals falls to zero. Thus the switch must be retriggered once during each half of an alternating current power cycle.

To provide power to the internal power supply when the load is energized, the thermostat includes a circuit that inhibits the production of the triggering signal until a predetermined voltage, higher than the ignition voltage, is attained across the internal power supply shunting the switch. The current that flows during this pre-ignition period in each half-cycle charges a capacitor within the internal power supply. The charge in this capacitor provides electric power during the balance of the alternating current half-cycle in which the switch is closed and no external source of power is available for the internal power supply.

The output switch overcurrent protective circuit effectively measures the time relative to the zero-crossing within each alternating current half-cycle that this trigger voltage is attained. This time is a function of the impedance of the load since the internal power supply and the load are connected in series across the power supply and share its voltage in proportion to their impedances. When the load impedance is normal the predetermined voltage will be attained across the internal power supply at a predetermined time after zero crossing or after a predetermined number of phase degrees in the alternating current half-cycle. When the load impedance is shorted out, or otherwise drops appreciably, the internal power supply will experience a higher percentage of the total power supply voltage. Thus the predetermined voltage at which the trigger signal is produced occurs earlier in the alternating current half-cycle. The microprocessor senses this occurrence and when it repeats over several cycles, inhibits the generation of a triggering signal for a predetermined time period.

The additional circuitry required to accomplish this function simply consists of a conductor connecting the microprocessor to the rectified input of the internal power supply. The timing function is preferably attained by suitable programming of the microprocessor.

Other objectives, advantages and applications of the present invention will be made apparent by the following detailed description of the preferred embodiment of the invention.

DETAILED DESCRIPTION OF DRAWINGS

The description makes reference to the accompanying drawings in which.

DETAILED DESCRIPTION OF THE INVENTION

Figure 1:
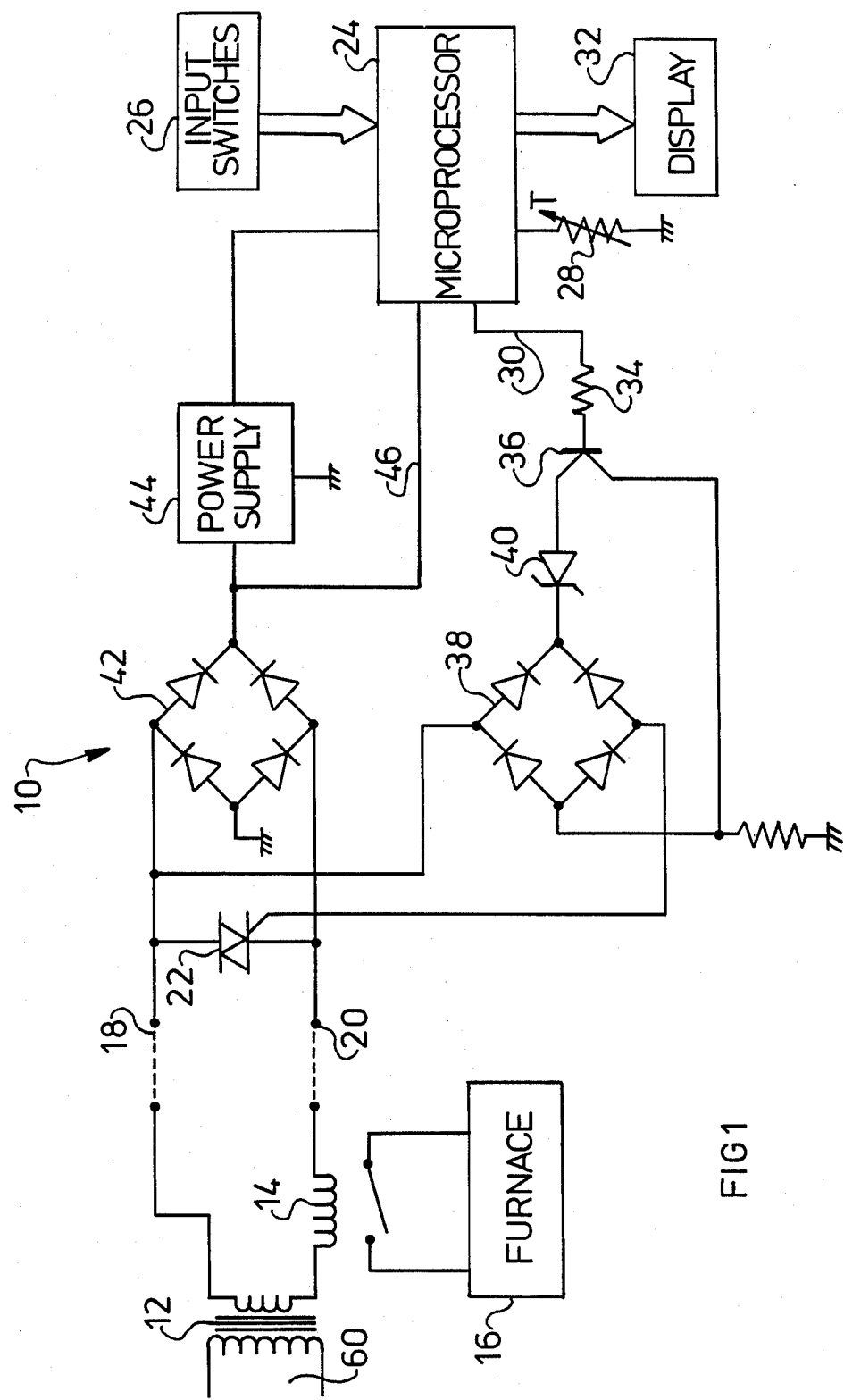
FIG. 1 is a schematic diagram of a preferred embodiment of a thermostat incorporating the switch protection circuitry of the present invention, connected to a typical load and power supply.

For the purposes of convenience the following description will be limited to the preferred embodiment, in which the present invention is incorporated in a thermostat. It should be understood that the present invention is equally applicable to similar control systems.

The thermostat 10 of the preferred embodiment of the present invention is adapted to control the application of alternating current power, preferably derived from the secondary winding of a transformer 12, to a temperature modifying load, illustrated as a relay 14 connected to a furnace 16. The transformer 12 constitutes a conventional stepdown transformer having sixty hertz power applied to its primary. Its low-voltage secondary is connected in series with the coil of the furnace relay 14 and a pair of output terminals 18 and 20 of the thermostat 10.

The terminals 18 and 20 are connected to the main terminals of a bidirectional, semiconductor switching device 22, preferably a triac. When the triac 22 is conductive the secondary of the transformer 12 applies power to the coil of the relay 14, closing the relay's output switch and energizing the furnace 16. When the output switching semiconductor 22 is non-conductive no power is applied to the coil of the relay and the furnace 16 is in a deenergized state.

Other embodiments of the invention might have the capability of controlling air conditioners and blower motors forming part of the temperature control system.

The triac 22 has sufficient capacity to carry the currents which result from the connection of the secondary of the transformer 12 to the coil of the relay 14. If the coil of the relay 14 were to be shorted out, relatively high currents would pass through the triac 22 when it became conductive. The purpose of the safety control circuit of the present invention is to protect the triac 22 from these excessive currents, which might permanently damage it, by switching it into a non-conductive mode when conditions associated with excessive currents are detected. The triac 22 is capable of conducting excessive currents for short periods of time, such as a few cycles of the AC voltage, but would burn out if these currents were sustained for a longer time.

The thermostat 10 employs a microprocessor 24 as its primary controller. The microprocessor employed in a preferred embodiment of the invention is a TMS 1730 manufactured by Texas Instruments Incorporated. A group of input switches 26 are connected to the microprocessor 24 and allow an operator to enter signals representative of the desired temperature set-point into the thermostat. The thermostat may be of the type disclosed in U.S. Pat. No. 4,206,872 which stores a schedule of set-point temperatures to be attained at different times during the day.

Microprocessor 24 also connects to a thermistor 28 that exhibits a resistance which is a function of the ambient temperature. The microprocessor compares the ambient temperature with the desired set-point and provides a two state output signal on line 30. The signal on line 30 is high when the controlled temperature modifying load is to be energized and is otherwise low. Microprocessor 24 also provides output signals to a display 32 which may indicate whether or not the load is being energized, the ambient temperature, the stored set-point, or other information.

The signal on line 30 is provided through a resistor 34 to the base of NPN transistor 36. The emitter of the transistor 36 is connected to the ground terminal of a full wave rectifier diode bridge 38 and the collector of the transistor is connected to the opposite terminal of the bridge 38 through a Zener diode 40. One output terminal of the bridge 38 is connected to the one of the main terminals of the triac 22 and the opposite terminal of the bridge 38 is connected to the gate of the triac 22.

When the triac 22 is non-conductive the impedance across its main terminals circuit is very high and its experiences substantially the entire voltage across the secondary of the transformer 12. This voltage is applied across the rectifier bridge 38. When the microprocessor output signal on line 30 is high, calling for energization of the load 16, the transistor 36 is conductive and the rectified output of the bridge 38 appears across the Zener diode 40. At the beginning of each half-cycle of the alternating current the voltage begins to build up at the Zener diode 40. When its breakdown voltage is attained, typically 15 volts, a current is provided to the gate of triac 22. Since the breakdown voltage of the Zener diode 40 exceeds the ignition voltage of triac 22, that is the minimum voltage to enable conduction through the triac, triac 22 goes into a conducting mode and its lowered impedance causes the coil of the relay 14 to become energized.

While the energizing signal on line 30 from the microprocessor 24 is high, the triac 22 will go into conduction in each half-cycle of the power supply, after the breakdown voltage of the Zener diode 40 has been attained. The resultant voltage across relay 14 is graphically illustrated in FIG. 2a. Each half-power cycle is delayed until the instantaneous line voltage has reached $V_z$, the breakdown voltage of the Zener diode 40. The triac 22 is then triggered into conduction for the balance of the half-cycle. When the voltage across its main terminals approaches zero, the current through triac 22 falls below the holding value and triac 22 becomes non-conductive. Triac 22 is again triggered into conduction for the next half-cycle when Zener diode 40 again breaks down.

This slight delay in conduction, which does not appreciably effect the power provided to the coil of the relay 14, is used to provide a power source for the microprocessor 24 during those times the microprocessor is calling for conduction of the triac 22. A full wave rectifier bridge 42 is connected across the power terminals of triac 22 and provides rectified power to a microprocessor power supply 44. When the triac 22 is not triggered into conduction the rectifier 42 receives alternating current power during the full voltage cycle. When the triac 22 is triggered into conduction the bridge 42 receives power in the form of pulses 50 (FIG. 2b) for the initial few degrees of each half power cycle, until Zener diode 40 breaks down. This power is sufficient for the purposes of the power supply 44, which contains a capacitor (not shown) and stores power to provide a smooth output during the entire alternating current cycle.

Figure 2:
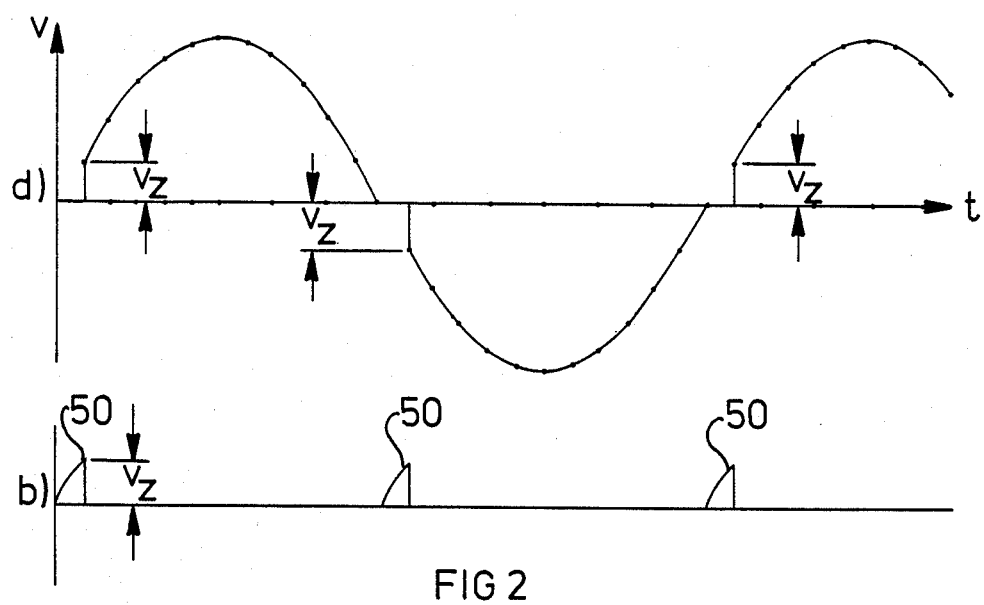
FIG. 2 is a plot of voltages that appear at various points in the circuit during operation of the system.

In order to achieve the purpose of the present invention of limiting conduction of the solid state output switch 22 when the coil of the relay 14 becomes shorted, line 46 is provided connecting the output of the bridge rectifier 42 to microprocessor 24. The voltage at the output of the rectifier 42 which occurs when the triac 22 is triggered into the conductive mode, is illustrated in FIG. 2b. It consists of a series of pulses 50, each of which begins at zero-crossing of the alternating current cycle and continues until the Zener diode 40 breaks down and causes the triac 22 to conduct. The width of these pulses 50 will be dependant upon the impedance of the coil of relay 14. When the relay coil is operating properly the voltage of the source (the secondary winding of the transformer 12) is shared by the relay coil and the internal power supply 44 while the triac is non-conductive. If the relay were to be shorted, resulting in an impedance of near zero, substantially the full line voltage would occur across the triac 22. Accordingly, the breakdown voltage of the Zener diode 40 would be attained appreciably earlier in each half-cycle and the pulses 50 of FIG. 2b would be substantially narrower.

Figure 3:
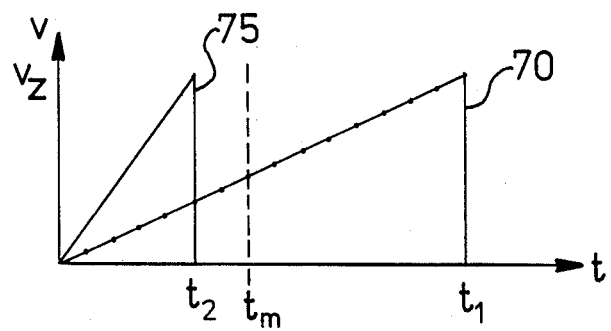
FIG. 3 is a plot of normal and abnormal pulses from the rectifier which are supplied to the power supply of the thermostat.

This difference in pulse width is illustrated in FIG. 3. FIG. 3 illustrates normal pulse 70 and abnormal pulse 75 which indicates excessive current. Note that because these pulses 50 occur near the zero crossing and because sin x approximates x for small x, the slope of these pulses in nearly linear. Normal pulse 70 has a pulse width of $t_1$. Abnormal pulse 75 has a pulse width $t_2$. The pulse width $t_2$ of abnormal pulse 75 is less than a predetermined minimum value $t_m$. The predetermined minimum value $t_m$ is the trigger point for the overload protection. Microprocessor 24 is programmed to inhibit the generator of the triggering signal on line 30 when the pulse width is less than $t_m$ for more than a predetermined number of these pulses 50.

Figure 4:
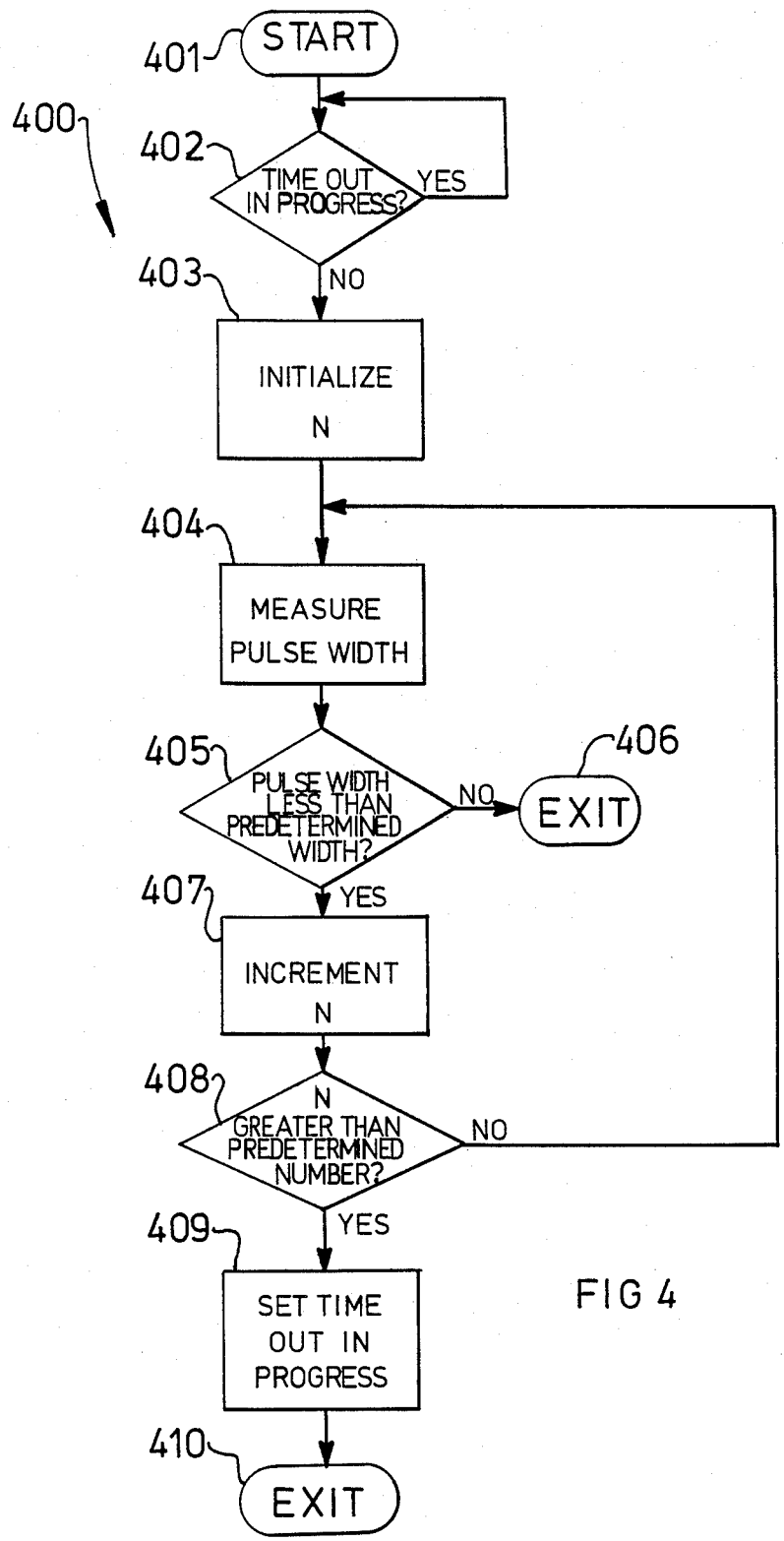
FIG. 4 is a flow chart illustrating a subroutine in the program of the microprocessor for executing the overload protection of the present invention.

FIG. 4 illustrates subroutine 400 of the program controlling microprocessor 24. Subroutine 400 enables microprocessor 24 to perform the overload protection function. Subroutine 400 is preferably executed by entry at start block 401 periodically any time microprocessor 24 generates a high energizing signal on line 30. This may be achieved by placing the subroutine call at an appropriate location within the main program controlling microprocessor 24 in accordance with known principles of the microprocessor art. It is not necessary to execute subroutine 400 when the main program causes microprocessor 24 to generate a low signal on line 30.

Upon entry of subroutine 400 via start block 401, the subroutine 400 tests to determine whether a previous time out is in progress (decision block 402). This test indicates when the microprocessor 24 has previously detected an overload condition and provided protection to triac 22 by inhibiting the energizing signal on line 30. If this is the case, the subroutine continues to test for the expiration of the time out (decision block 402). The subroutine proceeds to the next step once any such time out is completed.

Subroutine 400 next initializes a variable N (processing block 403). This variable N is employed to determine whether an overload fault condition is repeated more than a predetermined number of times. Initialization of this variable can be achieved by clearing the contents of a register used to store this variable.

Subroutine 400 next measures the pulse width of the next pulse 50 (processing block 404). This can be done by counting the number of pulses of a relatively high frequency pulse signal occuring during the duration of a pulse 50. One manner of doing this is to employ the instruction cycle of microprocessor 24 which is typically much higher than the 60 hertz rate of pulses 50. Upon detection of the start pulse 50, microprocessor 24 is placed in a tight loop which tests to determine if pulse 50 is complete, that is if the signal on line 46 is low, increments a register and repeats if pulse 50 is not complete. Upon detection of the end of pulse 50, the count in the counter is related to the pulse width of the pulse 50 and the rate of execution of instructions in microprocessor 24. Since the instruction rate will generally be relatively fixed and stable, the count indicates the pulse width. Of course there are other methods of measuring the pulse width of pulses 50.

Subroutine 400 then tests to determine if the measured pulse width is less than the minimum acceptable value $t_m$ (decision block 405). If the pulse width is greater than or equal to the predetermined value $t_m$, then operation is normal. Thus subroutine 400 is exited (exit block 406). As noted above, subroutine 400 should be periodically executed any time the energizing signal on line 30 is high in order to detect an overload fault as soon as possible after it occurs. Thus a normal exit from subroutine 400 should not preclude reexecuting subroutine 400.

If the pulse width was less than the predetermined minimum, then the variable N is incremented (processing block 407). This variable N is used to count the number of consecutive pulses 50 found to be shorter than the predetermined pulse width. Subroutine 400 tests N to determine if N is greater than the predetermined number of times (decision block 408). If N is not greater than the predetermined number, then a fault condition is not detected. Subroutine 400 returns to processing block 404 to measure the pulse length of the next pulse 50. If N is greater than the predetermined number, then the overload fault condition is detected.

Upon detection of the overload fault condition, subroutine 400 sets a time out interval. This serves to inhibit generation of a high energizing signal on line 30 for a predetermined period of time. This inhibition protects triac 22 from conducting when the coil of relay 14 is shorted. The time of this time out is preferably in the range from one minute to several minutes. This time is set sufficiently long to permit triac 22 to cool from the overcurrent and permit it to safely conduct for the predetermined number of cycles after this time out if the thermostat still commands energization of furnace 16 and the coil of relay 14 is still shorted. The duty cycle of triac 22 in this state should set the average current through triac 22 below its rated value.

It should be understood that the flow chart of subroutine 400 illustrated in FIG. 4 is intended to illustrate only the broad outline of subroutine 400. Those of ordinary skill in the microprocessor art would understand how to program microprocessor 24 to embody the principles of the invention from the flow chart illustrated in FIG. 4.

The microprocessor 24 essentially measures the time of attainment of the break down voltage of the Zener diode 40 relative to the zero-crossing time of each alternating current half-cycle. The circuit is simple, does not add any appreciable cost to the thermostat and allows the use of a solid state switching device rather than hard contacts.

Having thus described my invention I claim:

1. In a control device for controlling the application of power from an alternating current power source to a load having a normal impedance, said control switch connected in series with the alternating current power source and the load so that alternating current is supplied to the load when the switch is in a conductive state, means for inhibiting the initiation of conduction by the solid state switch when the impedance of the load is so substantially below its normal value that current of a magnitude potentially destructive to the solid state switch would pass through the switch if it were in its conductive state, comprising:
 a shunt impedance connected in shunt with the solid state switch and in series with the load and the alternating current power source, said shunt impedance forming an internal power supply for the control device deriving power from the alternating current power source from the voltage across the solid state switch when the solid state switch is nonconductive;
 first means for inhibiting the application of triggering signals to the solid state switch following each zero-crossing of the alternating current power source until a predetermined voltage is built up across said shunt impedance to provide an interval of electric power when the solid state switch is nominally conducting; and
 second means for inhibiting the application of triggering signals to the solid state switch for a predetermined time when the rate of rise of the voltage across said shunt impedance exceeds the rate which would exist if the impedance of the load was said normal value.

2. The control device of claim 1 wherein said second means for inhibiting the application of triggering signals to the solid state switch when the rate of rise of the voltage across said shunt impedance exceeds the rate which would exist if the impedance of the load was said normal value includes means for detecting the time, relative to the zero-crossing of the alternating current, required to attain the predetermined voltage across said shunt impedance.

3. The control device of claim 1 wherein said second means for inhibiting the application of triggering signals to the solid state switch when the rate of rise of the voltage across said shunt impedance exceeds the rate which would exist if the impedance of the load was said nominal value includes means for detecting the time, relative to the zero-crossing of the alternating current, required to attain the pedetermined voltage across said shunt impedance and means for inhibiting application of triggering signals to the solid state switch if the detected time is less than a predetermined time interval for more than a predetermined number of consecutive times.

4. The control device of claim 1 including a microprocessor for generating triggering signals for the solid state switch.

5. The control device of claim 4 wherein said second means for inhibiting the application of triggering signals to the solid state switch for a predetermined time when the rate of rise of the voltage across said impedance exceeds the rate which would exist if the impedance of the load was said normal value includes:
 means controlled by said microprocessor, to measure the time, relative to the zero-crossing of the alternating current, required to attain a predetermined voltage across said shunt impedance.

6. The control device of claim 5 further including:
 a means controlled by said microprocessor to selectively generate the triggering signal for control of the load in accordance with a control function of the control device.

7. The control device of claim 6 further including a temperature sensor connected to said microprocessor to measure the ambient temperature and wherein the control function of the control device is thermostatic control of a temperature modifying load.

8. The control device of claim 4 wherein said second means for inhibiting the application of triggering signals to the solid state switch when the rate of rise of the voltage across said shunt impedance exceeds the rate which would exist if the impedance of the load was said nominal value includes:
 means controlled by said microprocessor to measure the time, relative to the zero-crossing of the alternating current, required to attain a predetermined voltage across said shunt impedance; and
 means controlled by said microprocessor for inhibiting generation of triggering signals to the solid state switch if the measured time is less than a predetermined time interval for more than a predetermined number of consecutive times.

9. The control device of claim 1, wherein said predetermined time of said second means is larger than one cycle of the alternating current power source.

10. The control device of claim 1, wherein said predetermined time of said second means is longer than one minute.

11. The control device of claim 1, wherein: said predetermined voltage of said first means is 15 volts.

12. A control device for controlling the application of power from an alternating current power source to a load by control of conduction between a pair of terminals connected in series with the alternating current power source and the load, said control device comprising:
 a triggerable bidirectional solid state switch connected across the pair of terminals for conduction between the pair of terminals when triggered;
 a control device power supply connected across the pair of terminals in shunt with said solid state switch for deriving power for operation of the control device from the alternating current power source from the voltage across said solid state switch when said solid state switch is nonconductive;
 a control circuit connected to said solid state switch for selective generation of a triggering signal to trigger said solid state switch;

a trigger delay means connected to said solid state switch and said control circuit for delaying application of said triggering signal to said solid state switch following each zero-crossing of the alternating current power source until the voltage across said solid state switch reaches a predetermined voltage in order to provide an interval of electric power to said control circuit power supply when said solid state switch is nominally conductive;

a voltage rise time measuring means connected to said control device power supply for determining if the rate of rise of voltage across said control device power supply exceeds a predetermined rate related to the nominal impedance of the load; and an inhibiting means connected to said control device and said voltage rise time measuring means for inhibiting application of said triggering signal to said solid state switch for a predetermined length of time longer than one cycle of the alternating current power source if the rate of rise of voltage across said control device power supply exceeds said predetermined rate.

13. The control devie as claimed in claim 12, wherein:

said voltage rise time measuring means includes a pulse width measuring means connected to said control power supply for measuring the length of time relative to each zero-crossing of the alternating current power source for the voltage across said control device power supply to exceed said predetermined voltage; and said inhibiting means includes means connected to said pulse width measuring means for inhibiting application of said triggering signal to said solid stage switch for said predetermined length of time if said measured length of time relative to each zero-crossing of the alternating current power source for the voltage across said control device power supply to exceed said predetermined voltage is less than a predetermined amount.

14. The control device as claimed in claim 12, wherein:

said voltage rise time measuring means includes a pulse width measuring means connected to said control power supply for measuring the length of time relative to each zero-crossing of the alternating current power source for the voltage across said control device power supply to exceed said predetermined voltage; and said inhibiting means includes means connected to said pulse width measuring means for inhibiting application of said triggering signal to said solid state switch for said predetermined length of time if said measured length of time relative to each zero-crossing of the alternating current power source for the voltage across said control device power supply to exceed said predetermined voltage is less than a predetermined amount for more than a predetermined number of consecutive times.

15. The control device as claimed in claim 12, wherein said solid state switch is a triac.

16. A control device for controlling the application of power from an alternating current power source to a load by control of conduction between a pair of terminals connected in series with the alternating current power source and the load, said control device comprising:

a triggerable bidirectional solid state switch connected across the pair of terminals for conduction between the pair of terminals when triggered;

a control device power supply connected across the pair of terminals in shunt with said solid state switch for deriving power for operation of the control device from the alternating current power source from the voltage across said solid state switch when said solid state switch is nonconductive;

a trigger delay means connected to said solid state switch for delaying application of a triggering signal to said solid state switch following each zero-crossing of the alternating current power source until the voltage across said solid state switch reaches a predetermined voltage in order to provide an interval of electric power to said control circuit power supply when said solid state switch is nominally conductive; and a microprocessor means connected to said solid state switch, said control device power supply and said trigger delay means, said microprocessor means programmed for selectively generating a triggering signal for application to said trigger delay means to trigger said solid state switch for application of power from the alternating current power source to the load in accordance with a predetermined control function, determining if the rate of rise of voltage across said control device power supply exceeds a predetermined rate related to the nominal impedance of the load, and inhibiting generation of said triggering signal for a predetermined length of time longer than one cycle of the alternating current power source if the rate of rise of voltage across said control device power supply exceeds said predetermined rate for more than a predetermined number of consecutive times.

17. The control device as claimed in claim 16, further comprising:

a temperature sensing means connected to said microprocessor means;

wherein the load consists of a temperature modifying device; and wherein said predetermined control function of said microprocessor means is thermostatic control of a temperature modifying device.

* * * * *